(12) United States Patent
Beintner et al.

(10) Patent No.: US 6,933,206 B2
(45) Date of Patent: Aug. 23, 2005

(54) TRENCH ISOLATION EMPLOYING A HIGH ASPECT RATIO TRENCH

(75) Inventors: Jochen Beintner, Wappingers Falls, NY (US); Andreas Knorr, Austin, TX (US)

(73) Assignee: Infineon Technologies AG, Munich (DE)

( * ) Notice: Subject to any disclaimer, the term of this patent is extended or adjusted under 35 U.S.C. 154(b) by 98 days.

(21) Appl. No.: 10/683,668

(22) Filed: Oct. 10, 2003

(65) Prior Publication Data

US 2005/0079730 A1 Apr. 14, 2005

(51) Int. Cl.[7] .............................................. H01L 21/76
(52) U.S. Cl. ...................... 438/435; 438/424; 257/510; 257/513
(58) Field of Search ................................ 438/435, 424; 257/510, 513

(56) References Cited

U.S. PATENT DOCUMENTS

| 5,116,779 A | * | 5/1992 | Iguchi ......................... 438/425 |
| 6,596,607 B2 | * | 7/2003 | Ahn ............................ 438/424 |
| 6,812,115 B2 | * | 11/2004 | Wieczorek et al. ......... 438/424 |

* cited by examiner

*Primary Examiner*—Caridad Everhart
(74) *Attorney, Agent, or Firm*—Slater & Matsil, L.L.P.

(57) ABSTRACT

An isolation trench formed in a semiconductor substrate and is filled with at least one insulating liner layer that is deposited along sidewalls and a bottom region of the isolation trench and with at least one silicon liner layer that is deposited atop the insulating liner layer. An upper portion of the insulating liner layers are removed, and the silicon liner layers are removed. A remaining portion of the trench is filled with another insulating layer.

36 Claims, 18 Drawing Sheets

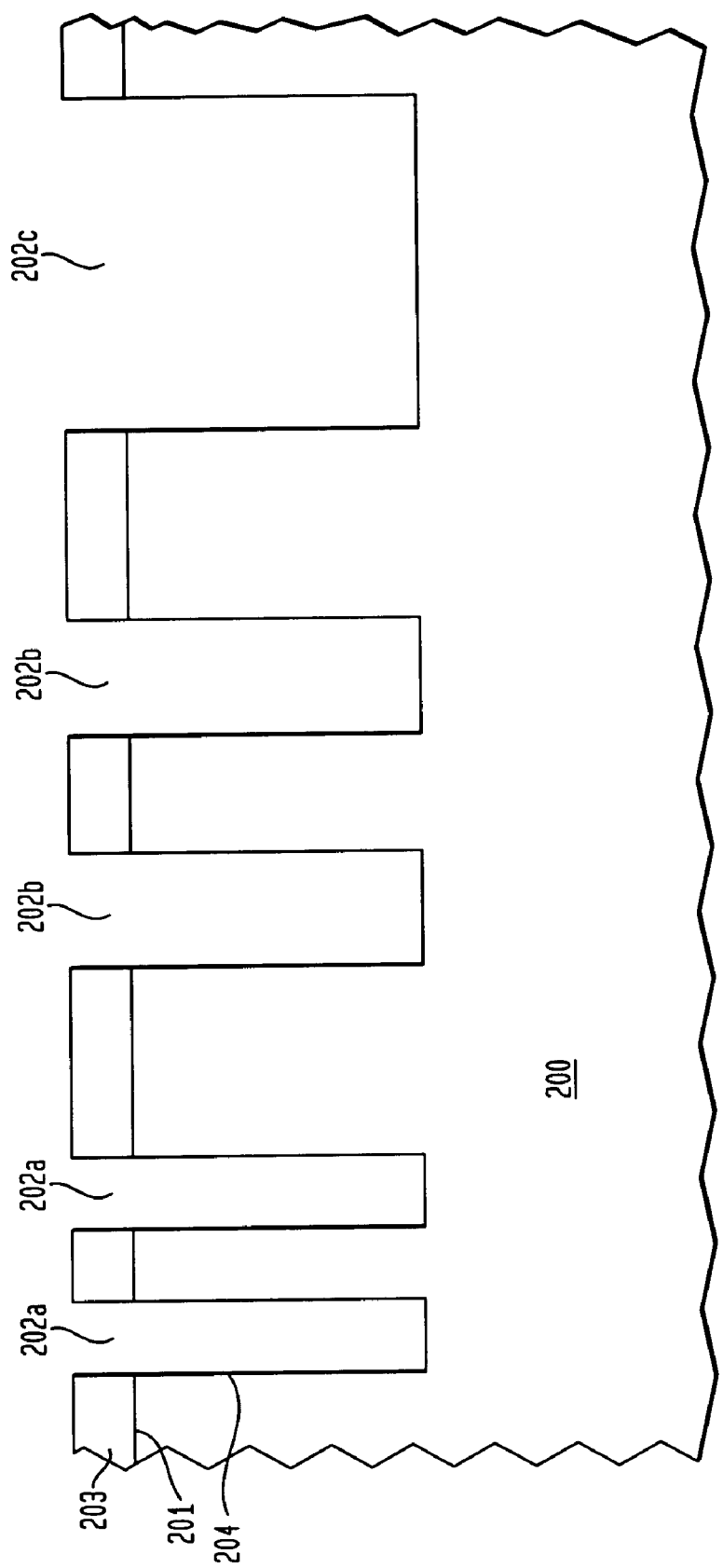

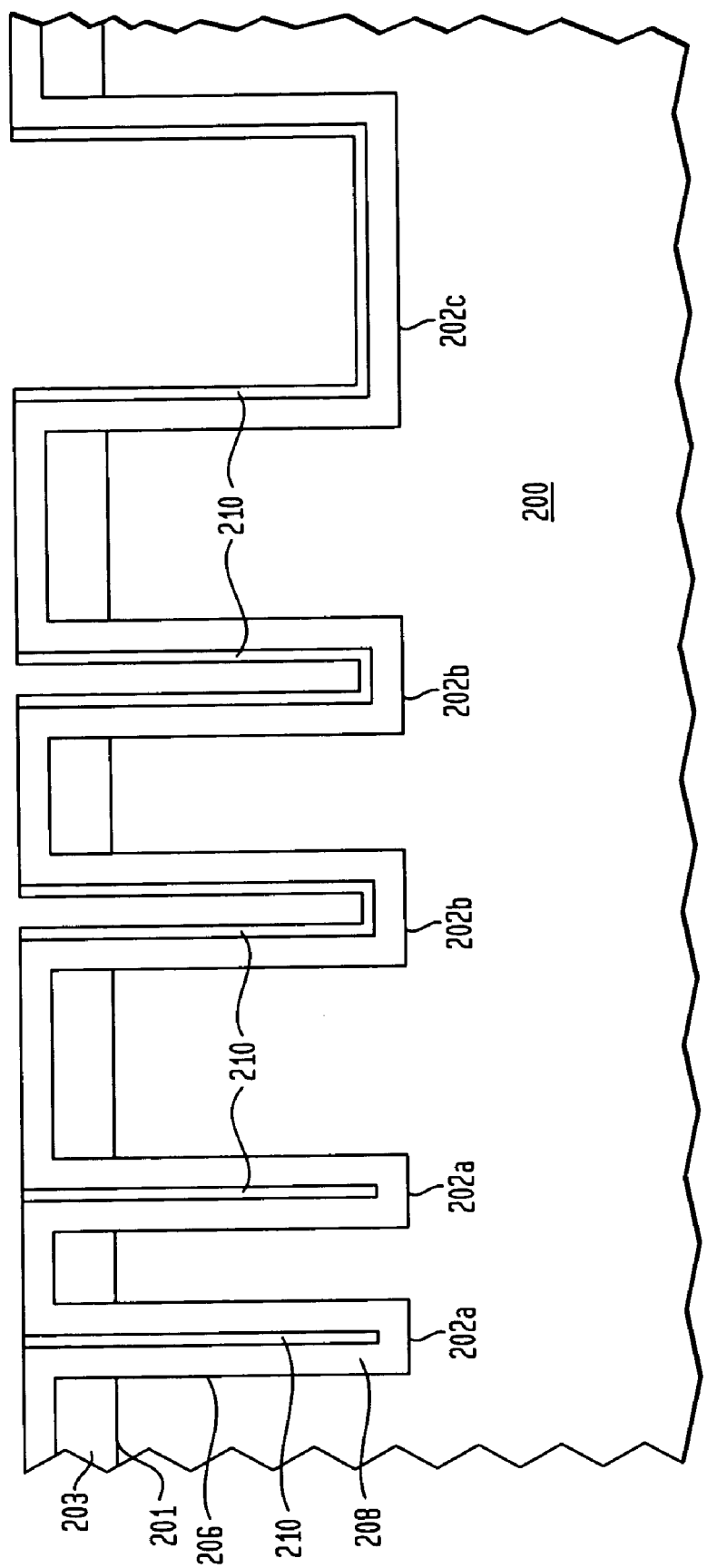

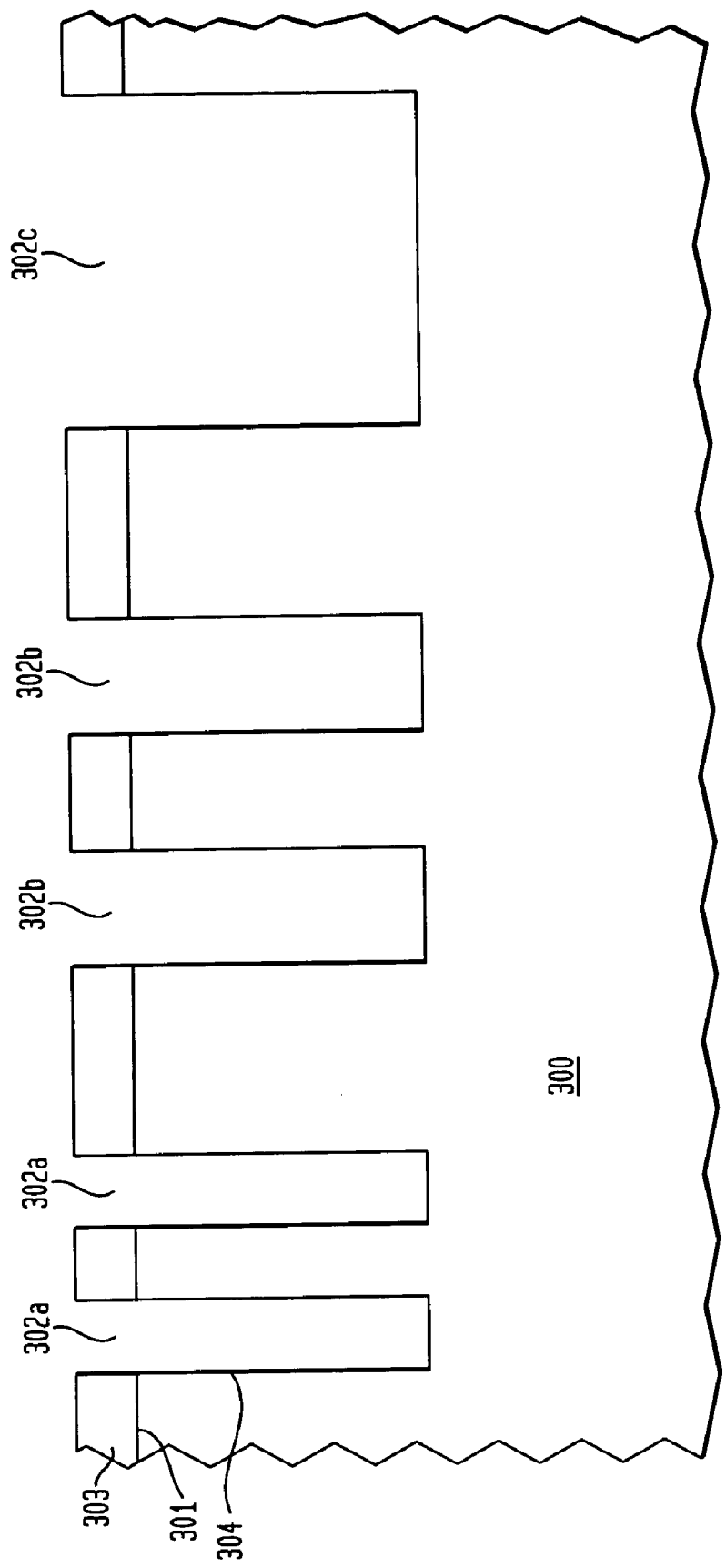

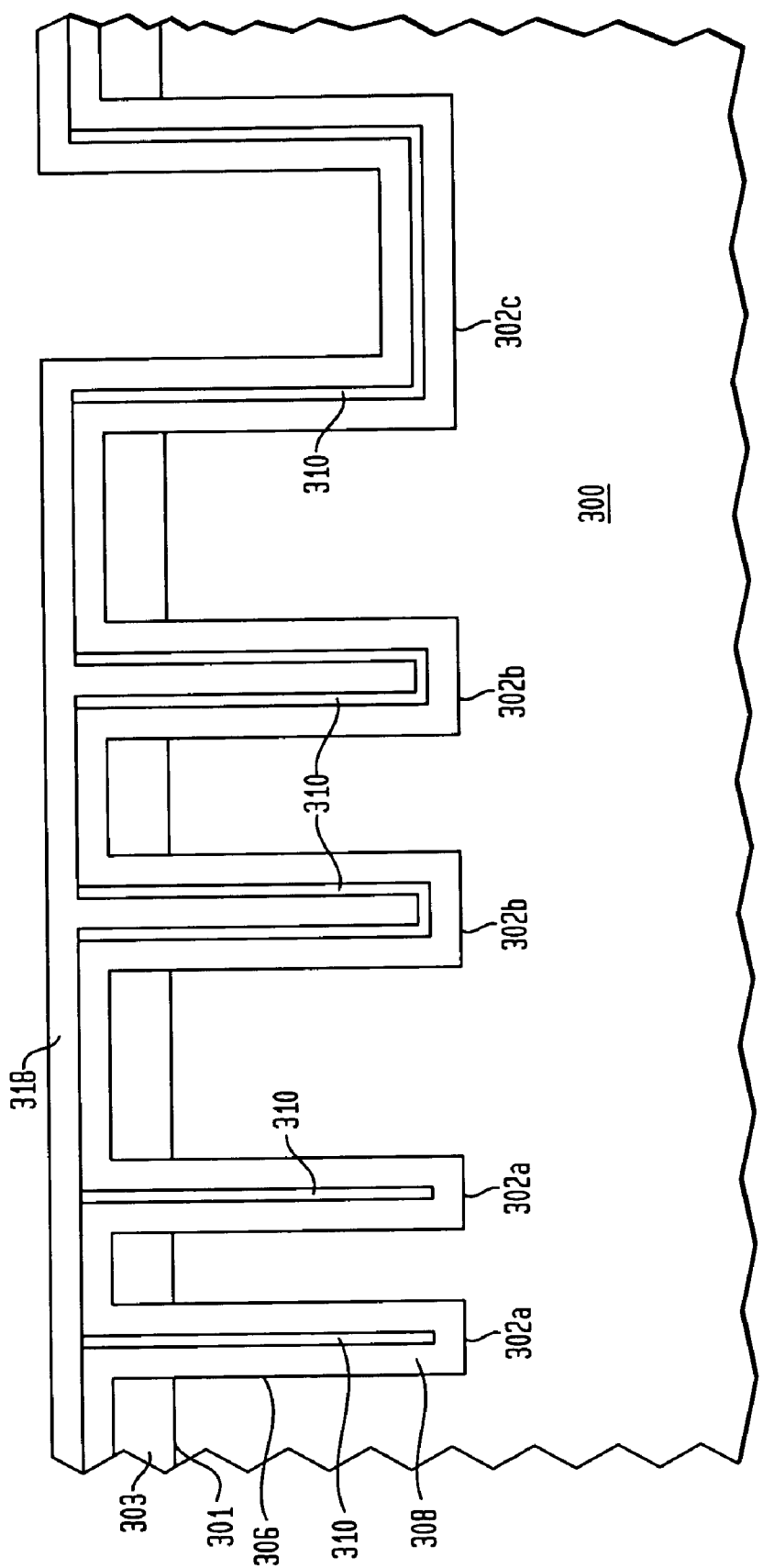

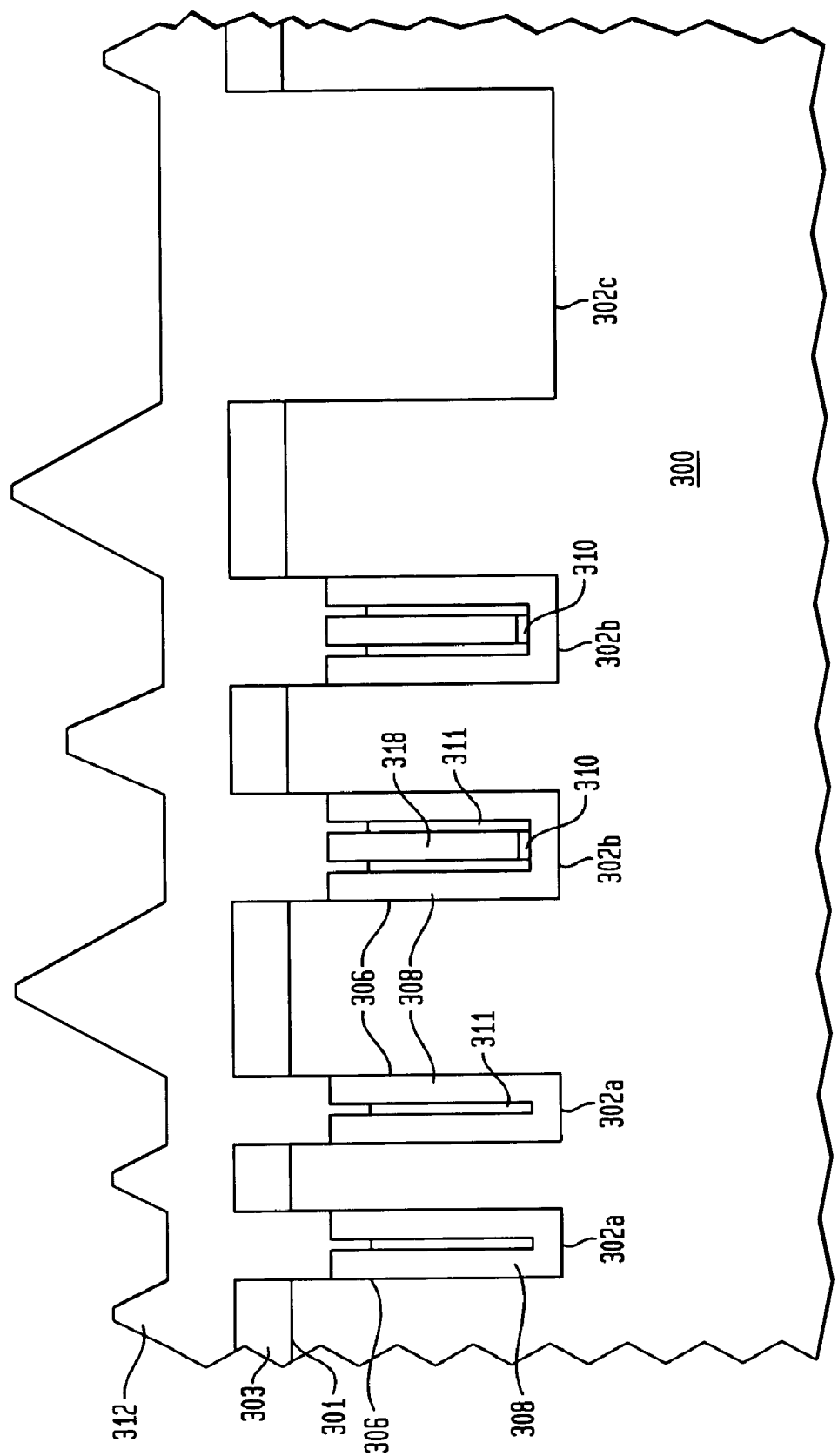

US 6,933,206 B2

TRENCH ISOLATION EMPLOYING A HIGH ASPECT RATIO TRENCH

BACKGROUND OF THE INVENTION

The present invention is directed to semiconductor integrated circuit devices and, more particularly, to the fabrication of semiconductor integrated circuit devices that include isolation trenches.

Various isolation methods have been employed to electrically isolate one or more semiconductor device elements formed in a substrate from other device elements. Such methods have included p-n junction isolation and localized oxidation of silicon (LOCOS). As newer generations of semiconductor device features become increasingly smaller and the number of elements increased, the known methods are often unsuitable or are too difficult to be manufactured in a controllable manner. To isolate such smaller and more highly integrated semiconductor device elements, trench isolation is commonly employed in which a trench is formed in a semiconductor substrate and surrounds the region that is to be electrically isolated and an insulating material is filled in the trench.

To form the isolation trench, one or more etch masking layers are typically deposited on a semiconductor substrate, and then a photoresist film is deposited on the etch masking layer and patterned. Selected regions of the etch masking layer are then removed to expose areas of the semiconductor substrate. The exposed areas of the semiconductor substrate are then etched to a desired depth, and an insulating material is deposited to fill the trench. Any portion of the insulating material that is deposited outside of or above the opening of the trench may then be removed. The etch masking material may then be removed or may be removed prior to the deposition of the insulating material.

As the size of semiconductor device features has further decreased, the width of the isolation trenches has likewise decreased. The depth of the isolation trenches however, has decreased less drastically and, in fact, may increase, such as for vertical transistor DRAMs, so that the ratio of the height of the trench to the width of the trench, known as the aspect ratio, has increased. When an insulating material, such as a high density plasma (HDP) oxide, is deposited in a trench having such higher aspect ratios, voids or seams are often formed within the insulating material located in the trench. The voids may be located entirely below the surface of the semiconductor substrate such that the insulating properties of the isolation trench and the insulating material are degraded. Alternatively, the voids may extend above the surface of the semiconductor substrate so that when the device is subsequently planarized, a seam is opened in the insulating material that may be subsequently filled with a polysilicon film or other conducting material that creates electrical shorts between device elements.

It is therefore desirable to provide a trench isolation process wherein the trench is filled with an insulating material in a manner that prevents the formation of voids and seams.

SUMMARY OF THE INVENTION

The present invention provides a trench isolation structure which a lower portion includes an insulating liner layer and a silicon liner layer having thicknesses selected that permit another insulating liner layer to fill an upper portion of the trench without voids.

In accordance with an aspect of the invention, an isolation trench formed in a semiconductor substrate is filled. An insulating liner layer is deposited along sidewalls and a bottom region of the isolation trench. A silicon liner layer is formed at least atop the insulating liner layer that lines the bottom and sidewalls of the isolation trench. An upper portion of the insulating liner layer is removed, and the silicon liner layer is removed. At least an upper portion of the trench is filled with another insulating layer.

According to another aspect of the invention, an isolation trench formed in a semiconductor substrate is filled. A first oxide liner layer having a thickness of 10 to 300 Å is formed along sidewalls and a bottom region of the isolation trench. A nitride liner layer having a thickness of 20 to 300 Å is deposited atop the first oxide liner layer. A further oxide liner layer is deposited atop the nitride liner layer. A silicon liner layer is deposited atop the further oxide liner layer that lines the sidewalls and bottom of the isolation trench. The silicon liner layer is selected from the group consisting of polysilicon and amorphous silicon. The silicon liner layer is planarized to the top of the further oxide liner layer. At least an upper 100 to 2000 Å portion of the further oxide liner layer is removed, and the silicon liner layer is removed. At least an upper portion of the trench is filled with another oxide layer. A thickness of the further oxide liner layer and a thickness of the silicon liner layer are selected such that the another oxide layer fills an upper portion of the trench without voids.

According to yet another aspect of the invention, an isolation trench formed in a semiconductor substrate is filled. An insulating layer is deposited at least along sidewalls and a bottom of the isolation trench, and a silicon liner layer is formed atop the insulating liner layer that lines the sidewalls and the bottom of the isolation trench. The above steps are repeated until the trench is filled. An upper portion of the insulating liner layer is removed, and the silicon liner layer is removed. At least an upper portion of the trench is filled with another insulating layer.

According to still another aspect of the invention, an isolation trench formed in a semiconductor substrate is filled. A first oxide liner layer having a thickness of 10 to 300 Å is formed along sidewalls and a bottom region of the isolation trench. A nitride liner layer, a thickness of 20 to 300 Å, is deposited atop the first oxide liner layer that lines the sidewalls and bottom of the isolation trench. A further oxide liner layer is deposited, a silicon liner layer is deposited atop the further oxide liner layer, and the silicon liner layer is planarized to the top of the further oxide liner layer. The silicon liner layer is selected from the group consisting of polysilicon and amorphous silicon. The deposition of the further oxide liner layer and the deposition and planarizing of the silicon liner layer are repeated until the isolation trench is filled. At least an upper 100 to 2000 Å portion of the further oxide liner layers is removed, and an upper portion of the silicon liner layers are removed. At least an upper portion of the trench is filled with another oxide liner layer. A thickness of a further oxide liner layer and a thickness of the silicon liner layer are selected such that the another oxide liner layer fills the upper portion of the trench without voids.

According to a further aspect of the invention, an isolation structure is formed within an isolation trench in the semiconductor substrate. The isolation trench has sidewalls and a bottom region. At least two insulating liner layers are formed along the lower portion of the sidewalls and along the bottom region of the isolation trench. At least one silicon liner layer is formed between the at least two insulating liner layers at a portion that lines the bottom of the trench. Another insulating liner layer fills a remaining portion of the trench.

According to a still further aspect of the invention, an isolation structure is formed within an isolation trench in a semiconductor substrate. The isolation trench has sidewalls and a bottom region. A first oxide liner layer has a thickness of 10 to 300 Å formed along the sidewalls and the bottom region of the isolation trench, and a nitride liner layer having a thickness of 20 to 300 Å is formed atop the first oxide liner layer. At least two insulating liner layers are formed atop a lower portion of the nitride liner layer and cover all of the sidewalls except for at least an uppermost 100 to 2000 Å. At least one silicon liner layer is formed between the at least two insulating liner layers at a portion of the further oxide liner layer that lines the bottom of the isolation trench. The silicon liner layer is selected from the group consisting of polysilicon and amorphous silicon. Another oxide layer fills a remaining portion of the trench. A thickness of the further oxide liner layer and a thickness of the silicon liner layer are selected such that the another oxide layer fills an upper portion of the trench without voids.

According to yet a further aspect of the invention, an isolation structure is formed within an isolation trench in the semiconductor substrate as described above. At least one further insulating liner layer is formed atop the silicon liner layer, and at least one further silicon liner layer is formed atop the further insulating liner layer.

The foregoing aspects, features and advantages of the present invention will be further appreciated when considered with reference to the following description of the preferred embodiments and accompanying drawings.

BRIEF DESCRIPTION OF THE DRAWINGS

FIGS. 2A–2G are cross-sectional diagrams illustrating process steps for forming trench isolation structures in a region of a semiconductor substrate in accordance with a process of the invention.

FIGS. 3A–3H are cross-sectional diagrams illustrating an alternative process for forming trench isolation structures in a region of a semiconductor substrate in accordance with the invention.

DETAILED DESCRIPTION

Figure 1:
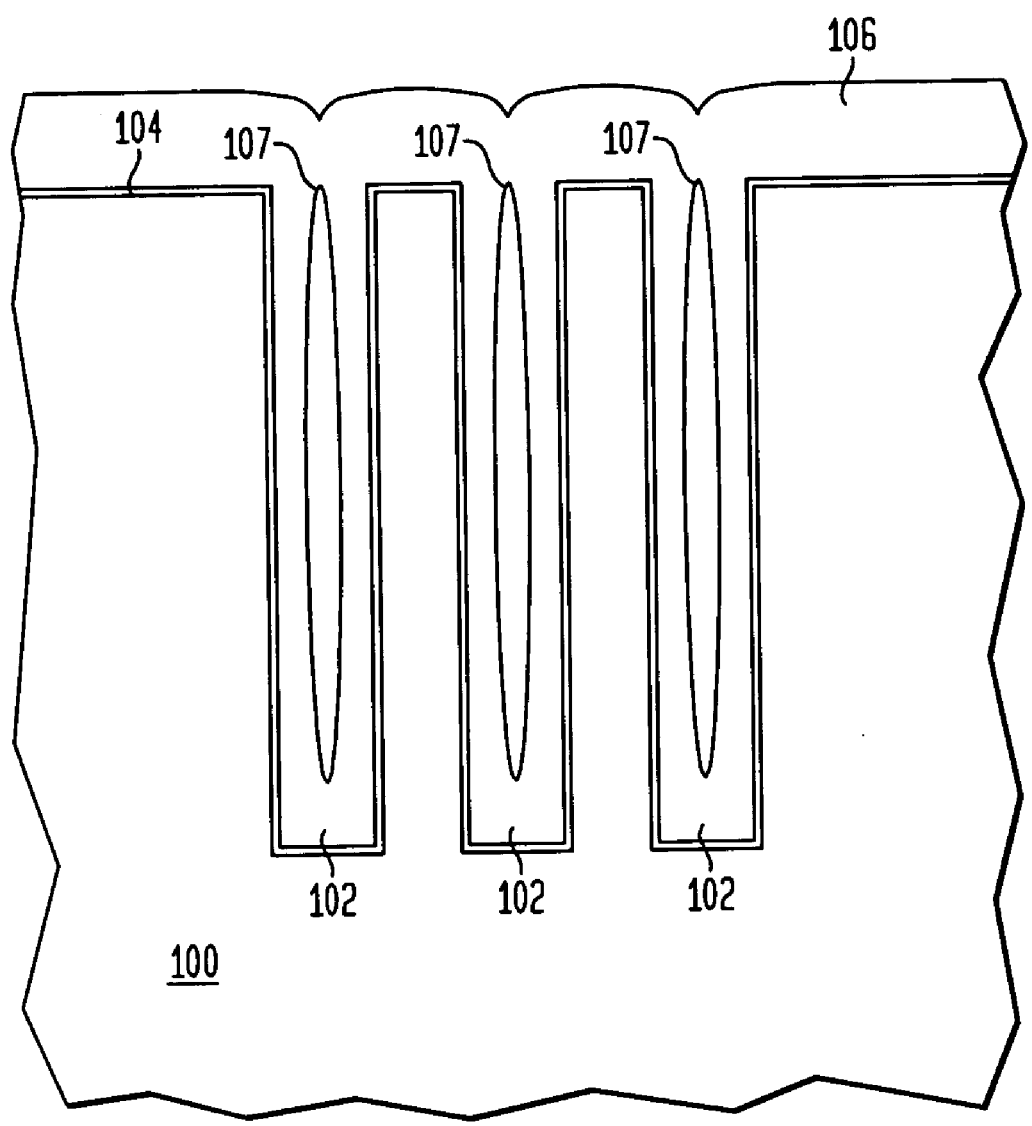
FIG. 1 is cross-sectional diagram illustrating a portion of a semiconductor substrate that includes a known trench isolation structure.

FIG. 1 shows a cross-sectional view of a portion of a substrate having a known trench isolation structure. An isolation trench 102 having a high aspect ratio, typically at least 5:1, is formed in a semiconductor substrate 100. The bottom and sidewalls of the trench 102 are lined with a thin liner material 104 and filled with an insulating material 106, such as a HDP oxide, low pressure chemical vapor deposition (LPCVD) oxide or BPSG. Because of the high aspect ratio of the trenches, the insulating material 106 closes off the tops of the trenches 102 before the trenches are filled and forms voids 107 when the insulating material 106 is deposited.

The invention provides for the filling of high aspect ratio, deep isolation trenches without the presence of voids close to the surface and with improved isolation characteristics.

Figure 2B:
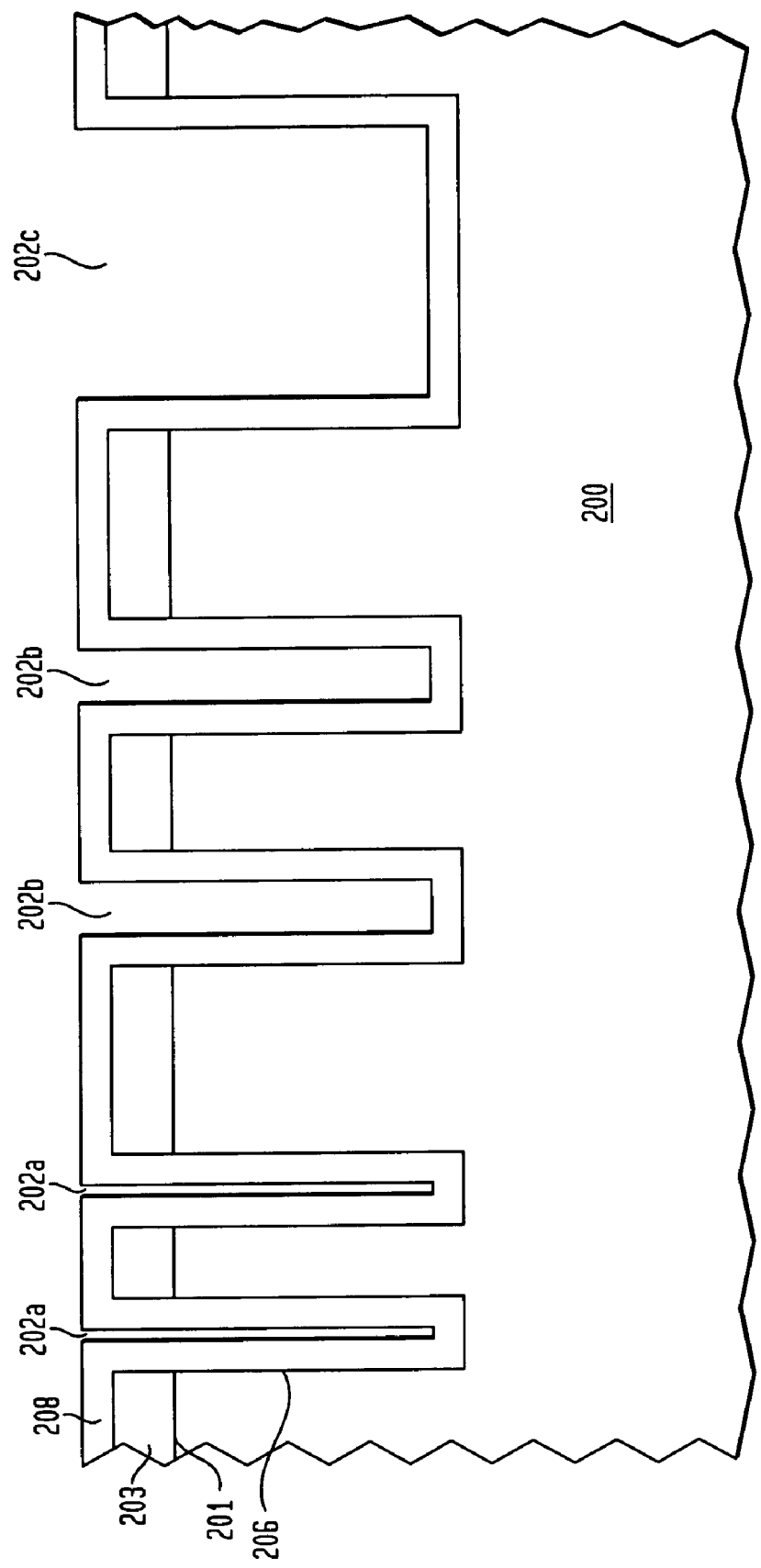

FIGS. 2A–2G illustrate a sequence of process steps for fabricating the trench isolation structure of the invention. First, as FIG. 2A shows, one or more isolation trenches 202 are etched in the substrate 200, including trenches 202a having a high height-to-width aspect ratio. For illustrative purposes, trenches 202a, 202b, 202c having three respective widths are shown.

The trenches 202 may be formed in the substrate 200 in a known manner. Typically, one or more etching mask layers are first deposited on the surface of the substrate 200. For example, a thin pad oxide film 201 is deposited on the substrate 200, and then a thicker pad nitride film 203, such as silicon nitride (SiN), is deposited. An optional hard mask layer or layers (not shown) may also be provided atop the silicon nitride layer. The hard mask layer or layers may be formed of various doped oxides such as BPSG, BSG, PSG, FSG, or the like, and/or amorphous silicon layers. An anti-reflective coating may be optionally added atop the hard mask layers to assist a subsequent high-resolution lithography step by altering the reflective property of the overall layer stack.

Then, a resist film (not shown) is deposited atop the etch mask layer or layers and is exposed and developed in a known manner to form openings to the etch mask layer or layers. Another anti-reflective coating layer may optionally be added atop the resist layer prior to exposure to further assist the high-resolution lithography step. Multiple light exposures may also be employed to better define or transfer the various fine-sized features. The exposed portions of the etch mask layers are then etched, and the resist layer may be removed.

Thereafter, the regions of the semiconductor substrate that are exposed by the openings in the etch mask layer or layers are etched to form the trenches 202. Some or all of the etch mask layers may then be removed. Here, as an example, the hard mask layer is removed, but the pad oxide layer 201 and the pad nitride layer 203 remain.

Then, a thin oxide liner layer 204 is formed on the sidewalls and bottom of the trenches 202 and, optionally, atop the pad nitride layer 203. Prior to the oxide growth, the wafer surface (including the trench walls) may also be cleaned to remove any organic or metallic contaminants and/or chemically oxidized to seal the surface with a 10–20 Å thick oxide layer to prevent surface contamination during wafer transfer into an oxidation tool.

The thin oxide liner layer 204 may thermally grown, either in a batch reactor, such as an oxidation furnace, or in a single wafer tool, such as a rapid thermal processor (RTP). The oxide may be thermally grown by heating the wafer in the presence of an oxygen-bearing gas, such as $O_2$, $O_3$, $N_2O$, or NO. Radical-assisted thermal oxidation, wherein oxygen radicals are first created from an oxygen-bearing gas using an excitation process, may alternatively be employed. The process time, the process temperature, and the partial pressure of the primary oxidizing agent are chosen so that an oxide layer of about 10 Å to 300 Å is grown.

Next, as FIG. 2B shows, a nitride liner layer 206, such as silicon nitride (SiN), typically having a thickness of about 20 Å to 200 Å is deposited. The nitride liner layer 206 is typically deposited using chemical vapor deposition (CVD), low pressure chemical vapor deposition (LPCVD), or other known methods. The thickness of the oxide liner layer is determined by the nitride liner layer deposition process. The oxide liner layer should be thick enough to prevent excessive nitrogen accumulation at the silicon/silicon oxide interface but thin enough to avoid any undesirable increase of the trench aspect ratio.

Then, a thicker oxide liner layer 208 is deposited atop the nitride liner layer 206. The thickness of the thick oxide liner layer 208 depends upon the width of the trenches 202a such that an opening should remain within the trenches 202 that is to be filled by a subsequent deposition step. The thick oxide liner layer 208 is typically deposited using a LPCVD process, other CVD process or other known methods.

Figure 2C:
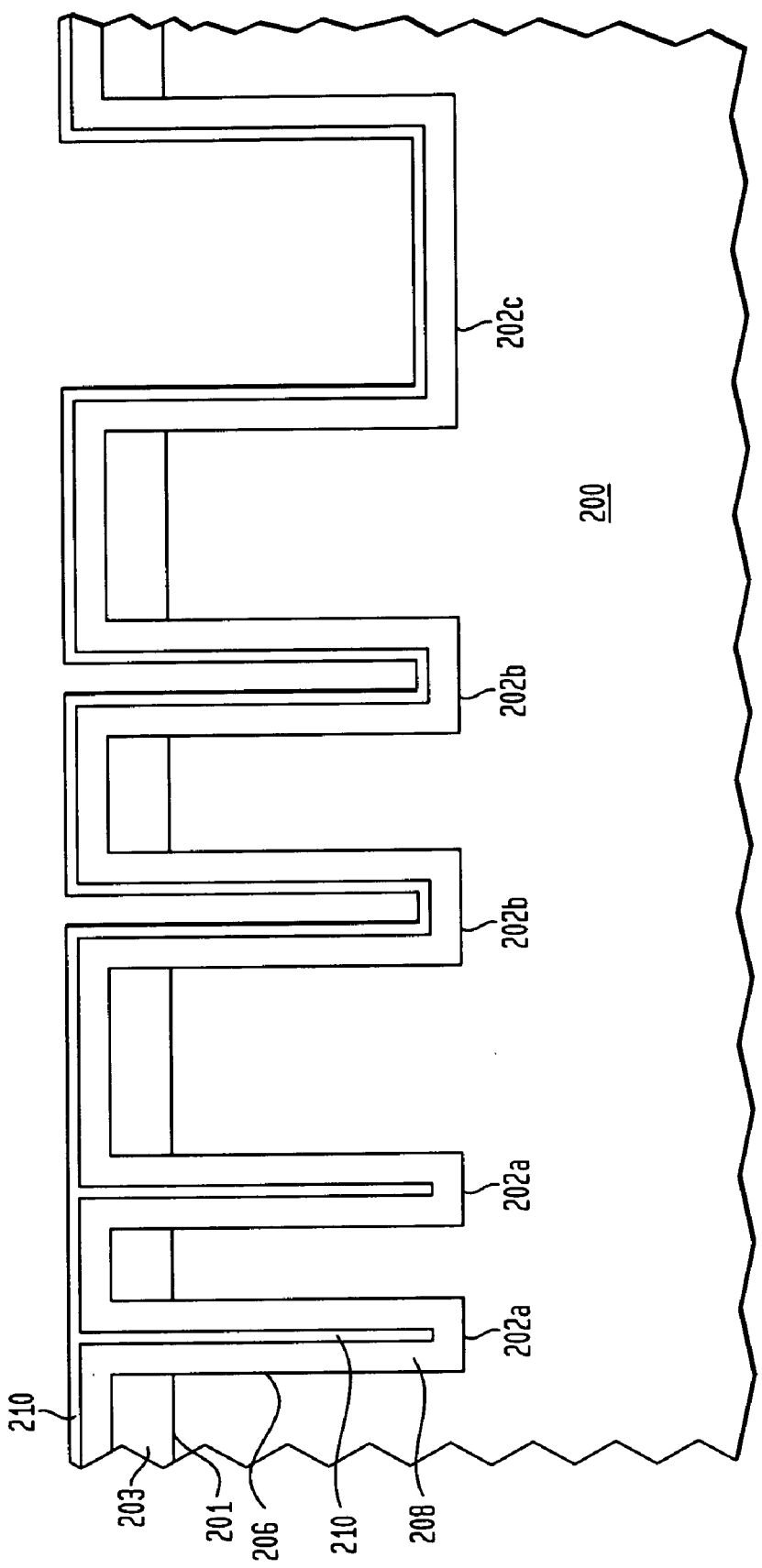

Next, as FIG. 2C shows, a polysilicon liner layer 210 is deposited to fill the high aspect ratio trenches 202a as well as to cover the remainder of the thick oxide liner layer 208 that is atop the substrate as well as within the wider isolation trenches 202b and 202c. The polysilicon layer is deposited preferably using a LPCVD step, though other CVD methods or other known methods may be used. The thickness of the polysilicon liner layer 210 and the thickness of the thick oxide liner layer 208 are chosen such that the high aspect ratio trenches 202a are filled without the formation of voids in the trenches as well as such that subsequent processing steps do not form voids in the trenches.

Alternatively a layer of amorphous silicon may be deposited in place of the polysilicon liner layer 210.

Then, as shown in FIG. 2D, the portion of the polysilicon liner layer 210 that extends above the openings of the trenches and atop the thick oxide liner layer 208 is removed, such as by chemical mechanical polishing (CMP) or by a plasma etch back process. When a plasma etch back process is used, the portion of the polysilicon liner layer 210 that lines the sidewalls and bottoms of the wider trenches 202b and 202c is also removed.

Figure 2E:
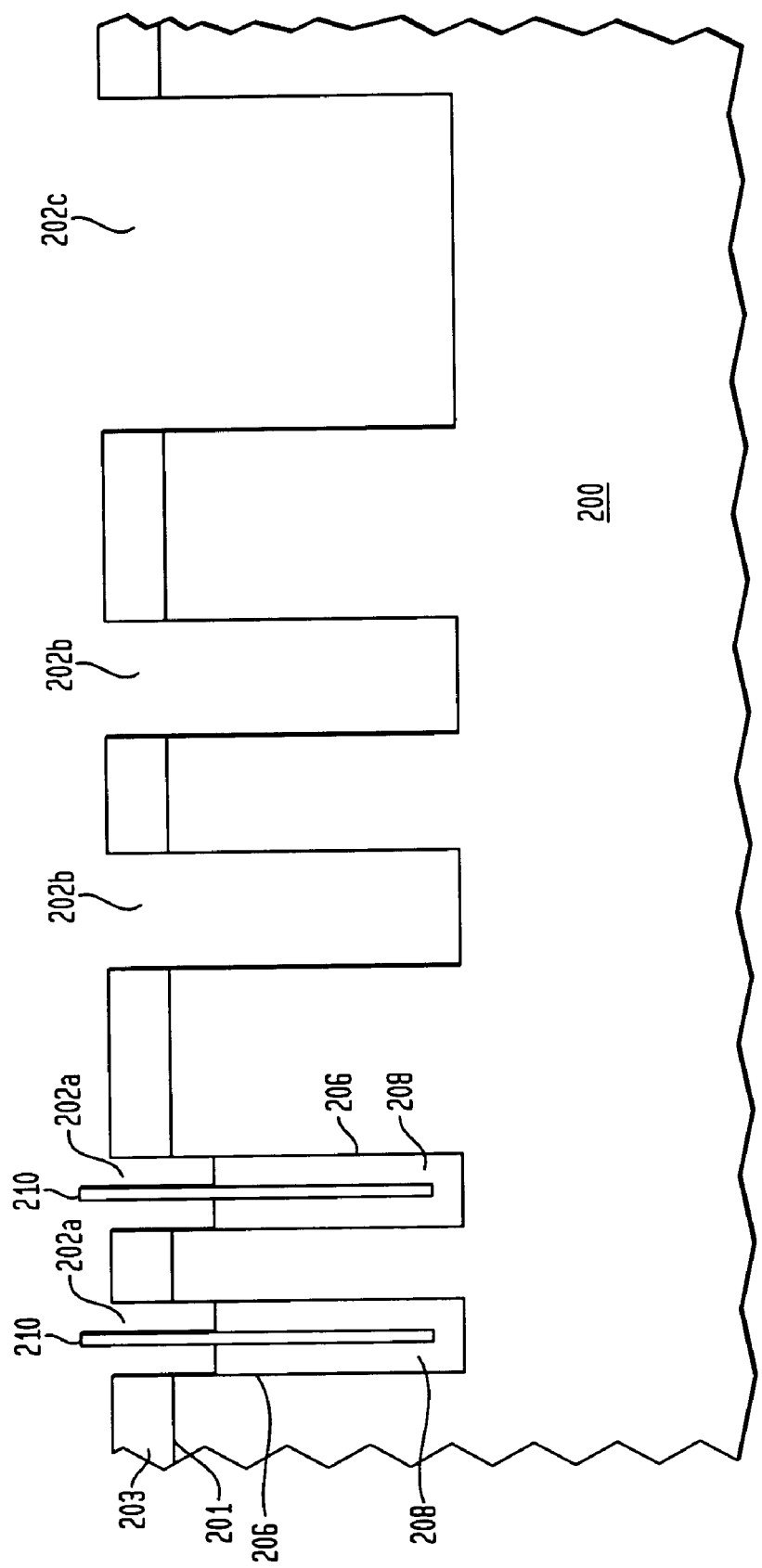

Then, as FIG. 2E shows, the thick oxide liner layer 208 is etched. The portion of the thick oxide liner layer that is above the openings of the trenches is removed as well as, optionally, the portion that lines the wider trenches 202b and 202C. In the high aspect ratio trenches 202a, the thick oxide liner layer 208 is removed only from the upper part of the trenches 202a so that the top of the oxide liner in the high aspect ratio trenches is about 100 to 2000 Å below the silicon surface. The quantity that remains in the high aspect ratio trenches depends on the subsequent process steps, such as HF cleaning steps, as well as on the depth of the isolation trench. The thick oxide liner layer 208 may be removed using a wet etch, such as an HF etch, or by a plasma etching step. The thick oxide liner etch back leaves pillars of the polysilicon liner layer 210 that extend from the tops of the remaining portion of the oxide liner layer to above the tops of the deep trenches.

Figure 2F:
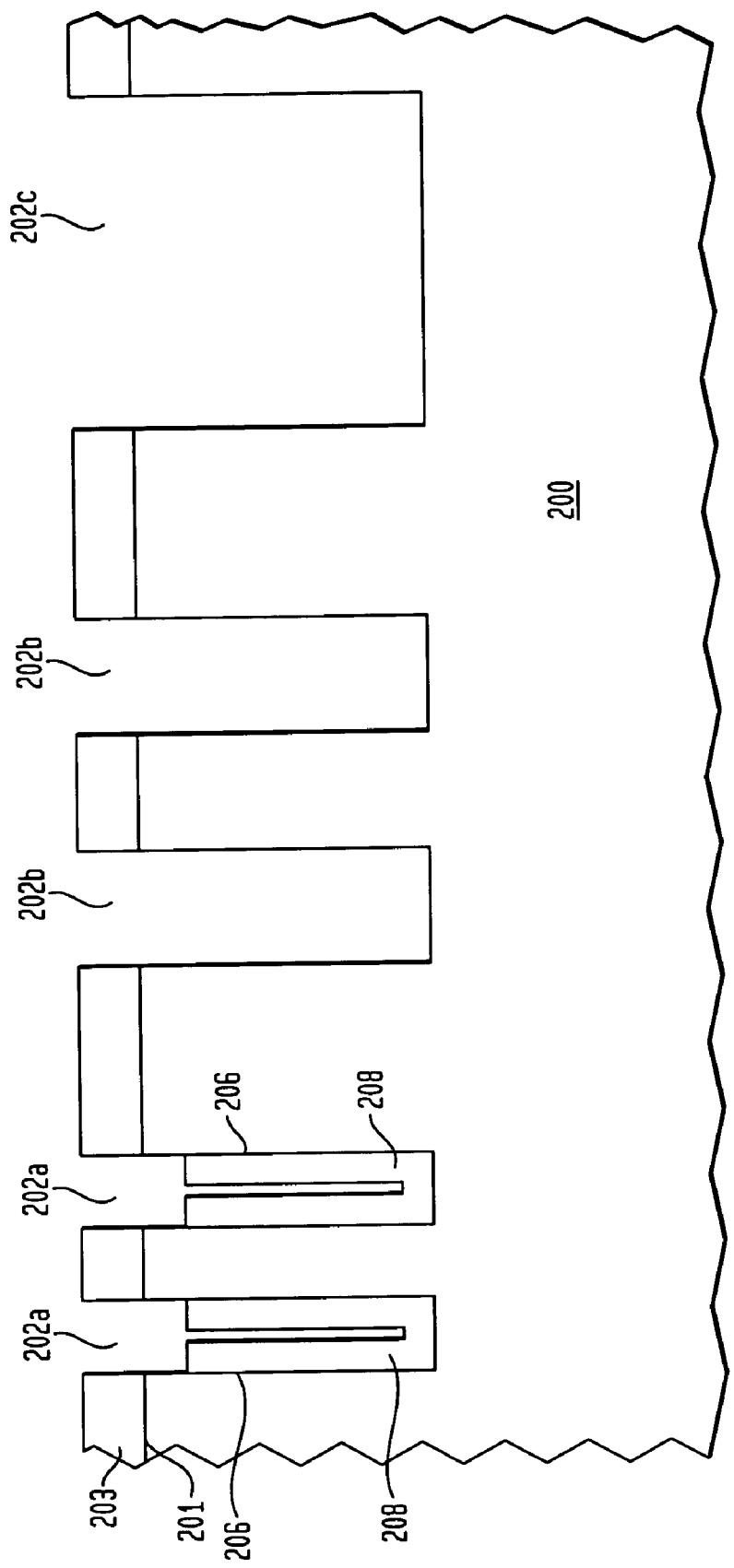

Next, as FIG. 2F shows, the polysilicon liner layer 210 is etched such that, preferably, all of the pillars of the polysilicon liner layer 210 are removed. The polysilicon is etched using a wet etch, such as using a $NH_4OH$ based solution, or by a plasma etch process.

Figure 2G:
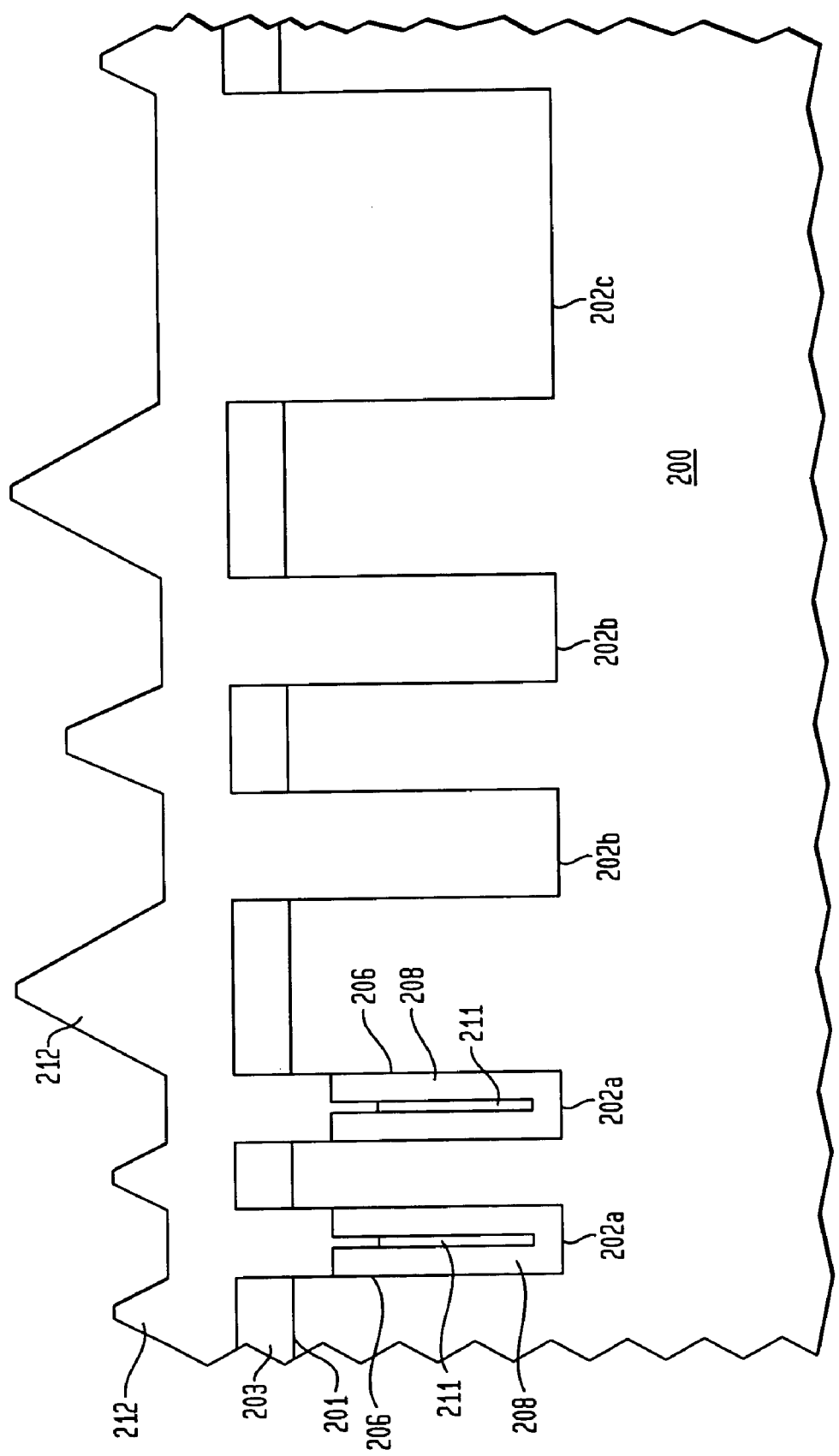

Thereafter, as shown in FIG. 2G, the exposed portions of the trenches 202a, as well as the trenches 202b and 202c, are filled with a HDP oxide which has a lower oxide etch rate than the thick oxide liner layer 208. The HDP oxide is deposited using a plasma enhanced CVD process (PECVD) that fills the upper part of the high aspect ratio trenches 202a without the formation of voids in the upper part of the trenches. Voids 211 may be formed in the lower portion of the trenches, however, without any adverse effects because the voids in the lower parts of the trenches are not opened during subsequent processing steps. The thickness of the HDP plasma layer 212 depends upon the depths of the trenches as well as the depth to which the further oxide liner layer 208 is previously etched back.

Alternatively, several successive depositions of thick oxide liner layers and polysilicon liner layers are carried out so that the wider deep trenches are also filled in without the formation of voids in the upper port of the trenches, as FIGS. 3A–3H show.

Figure 3B:
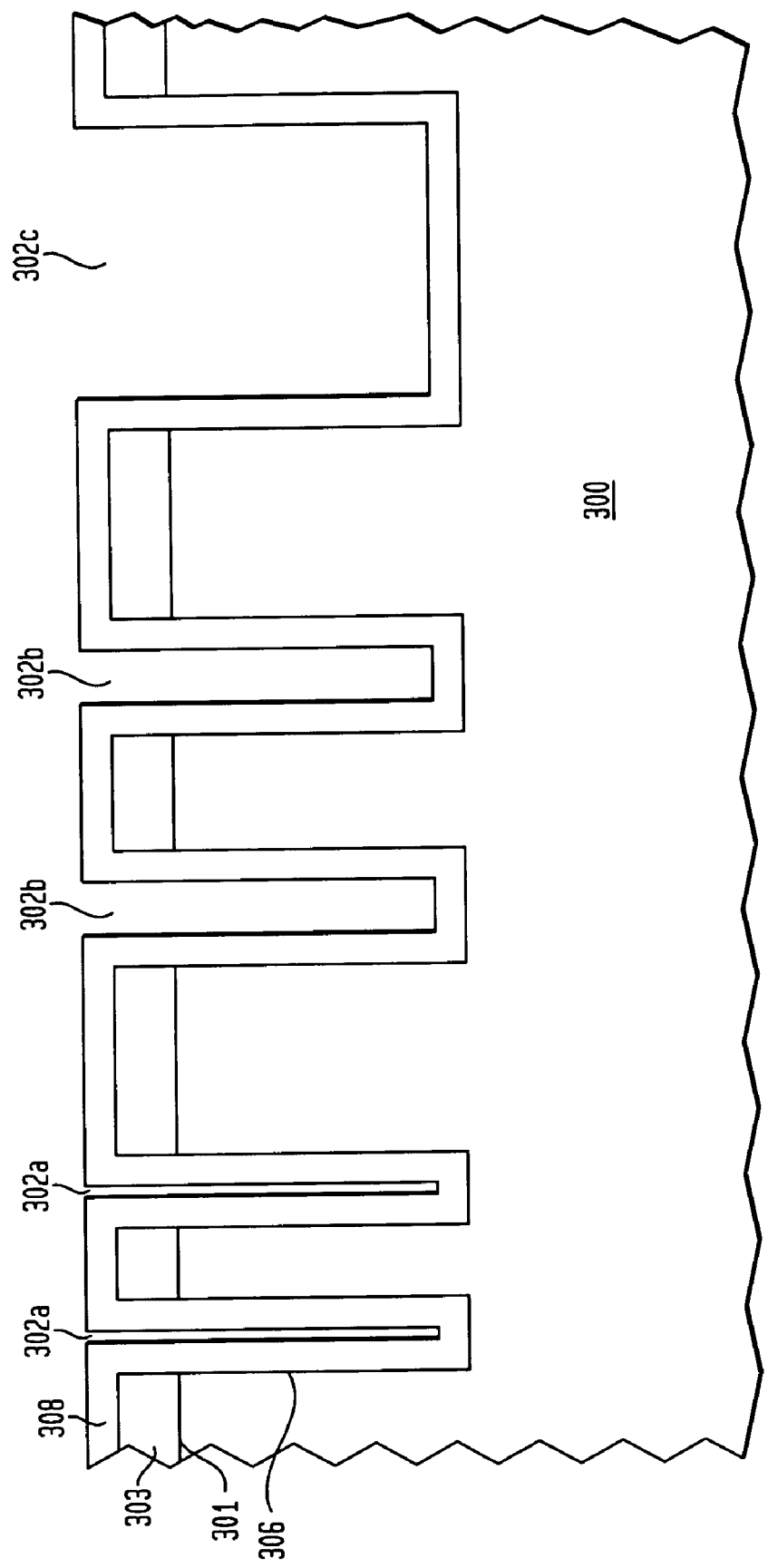
Figure 3C:
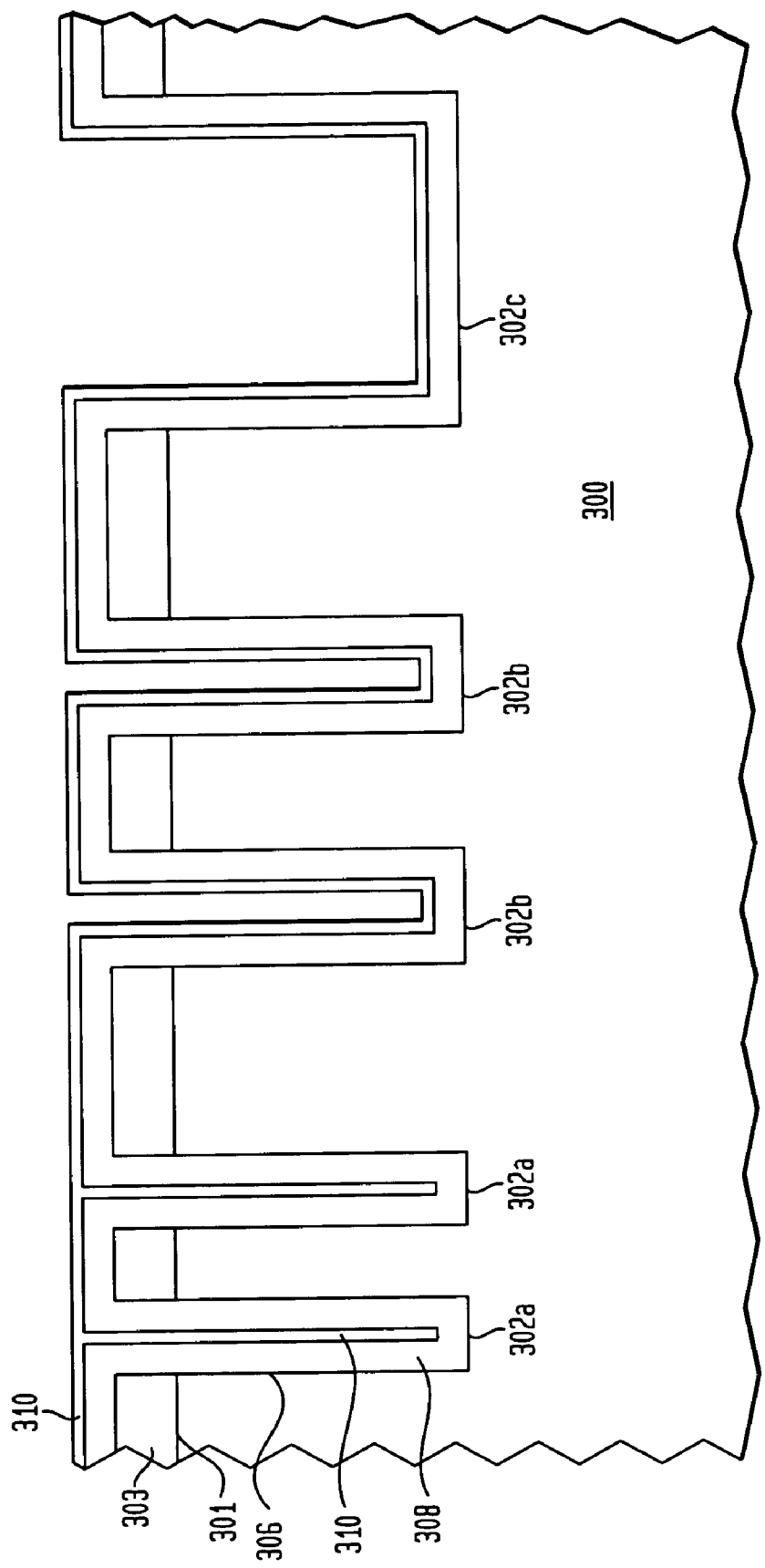
Figure 3D:
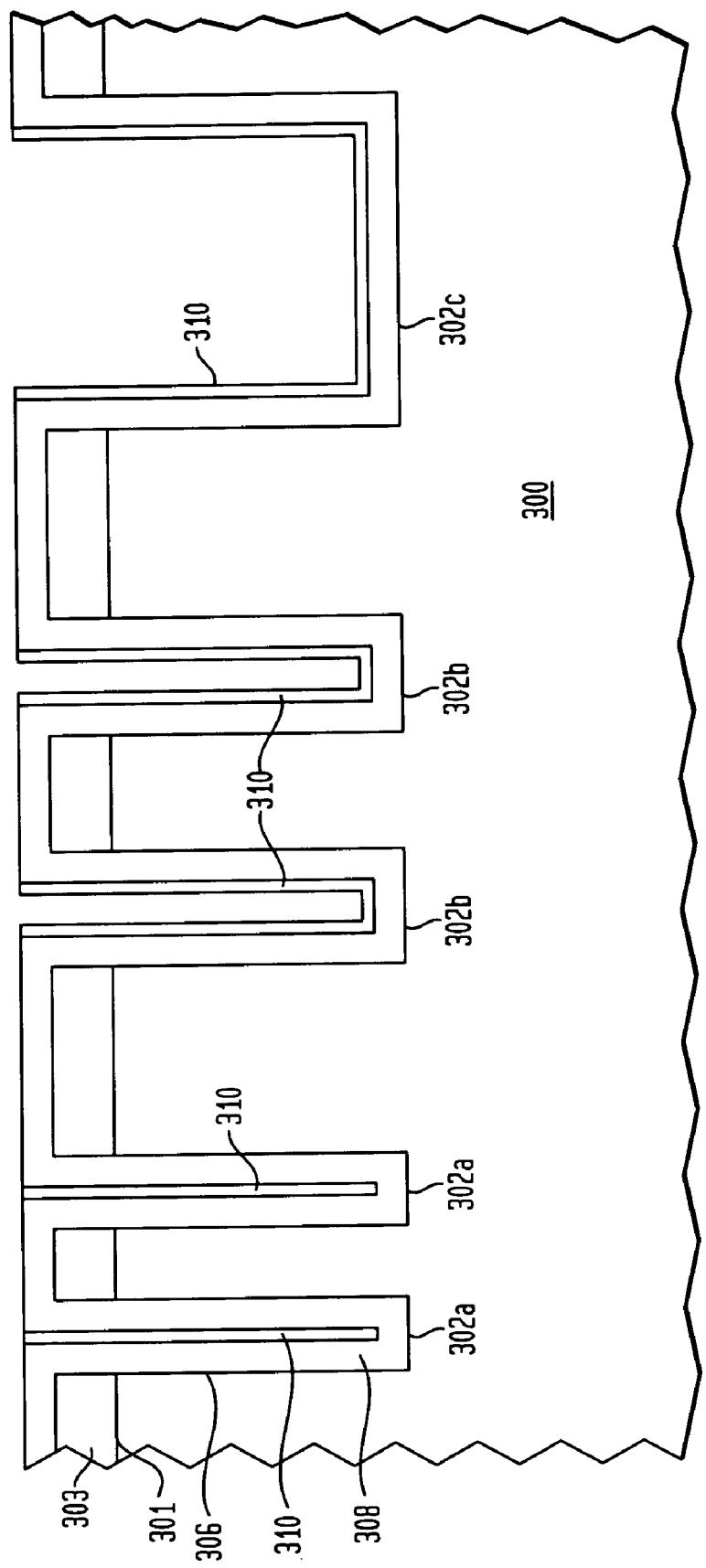

First, as FIG. 3A shows, isolation trenches 302a, 302b and 302c are formed as described above with reference to FIG. 2A, and a thin oxide liner layer 204 is grown also in the manner described above. Next, as shown in FIG. 3B, a nitride liner layer 306 and a thick oxide liner layer 308 are formed in the manner described above with reference to FIG. 2B. A polysilicon liner layer 310 is deposited, as FIG. 3C shows, in the manner described above with reference to FIG. 2C, and the polysilicon liner layer 310 is planarized as also described above, as shown in FIG. 3D.

Then, as FIG. 3E shows, a further thick oxide liner layer 318 is deposited atop the first thick oxide liner layer 308 and atop the polysilicon liner layer 310. The further thick oxide liner layer 308 may be deposited using known deposition methods, such as using a LPCVD processes.

Figure 4A:
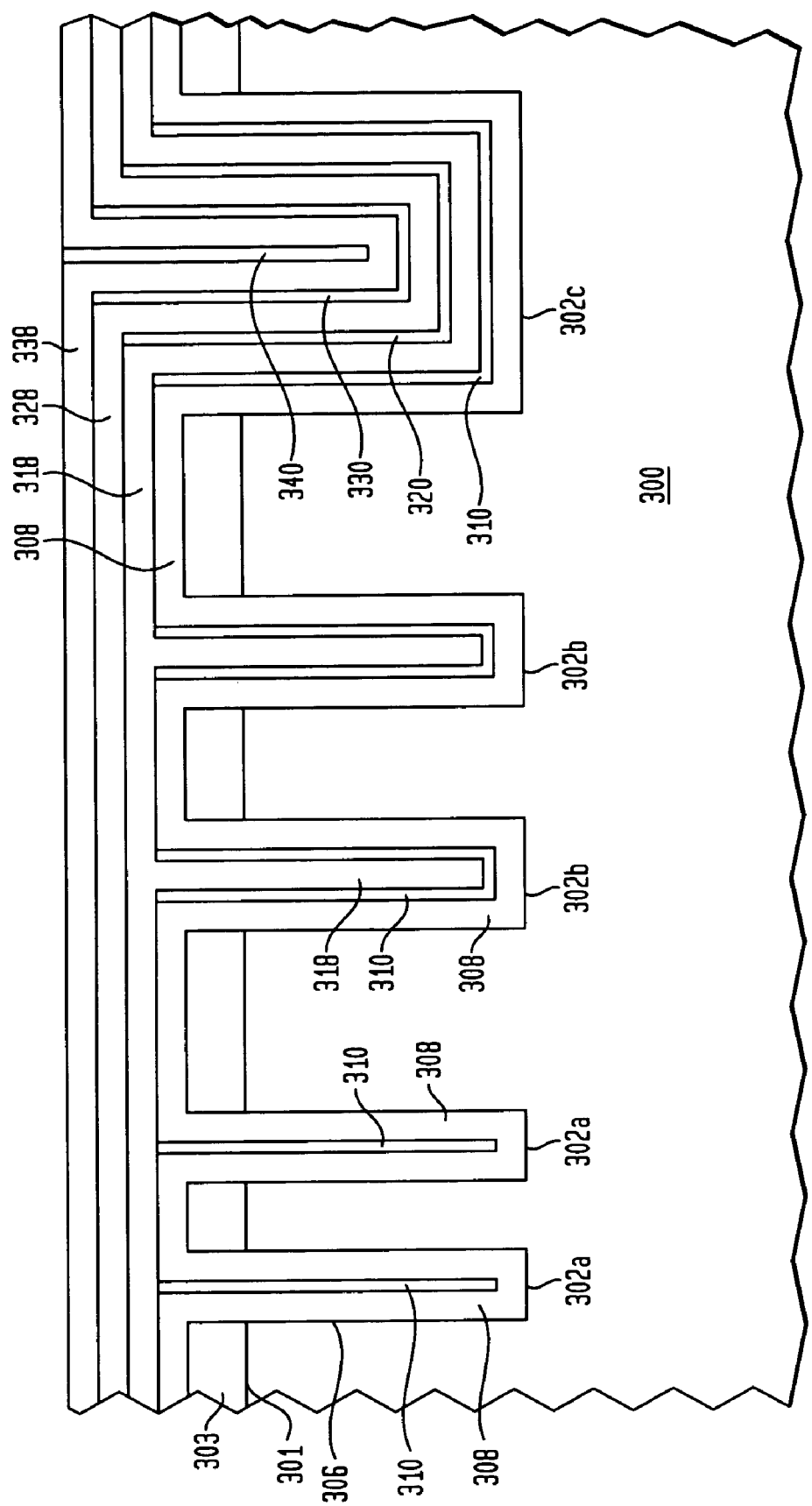
FIGS. 4A–4B are cross-sectional diagrams showing a further alternative process of the invention.

Here, the further thick oxide liner layer 318 fills the isolation trenches 302b. However, additional thick oxide and polysilicon depositions may be required to fill wider isolation trenches. FIG. 4A illustrates further process steps that may be carried out to the isolation trenches shown in FIG. 3E. After the deposition of the further thick oxide liner layer 318, a further polysilicon liner layer 320 is deposited and planarized, and then another thick oxide liner layer 328 is deposited. Next, another polysilicon liner layer 330 is deposited and planarized, and an additional thick oxide liner layer 338 is deposited. Finally, an additional polysilicon liner layer 340 is deposited and planarized to fill the deep trench 302c. The polysilicon deposition and planarization steps and the thick oxide deposition steps are carried out in the manner described above.

Thus, the thick oxide deposition step and the polysilicon deposition and planarization steps may be repeated as many times as needed until the isolation trench is filled. Preferably, the polysilicon deposition and planarization is the final step used to fill the trench, though the oxide deposition step may be the final step as long as no voids are present in the upper part of the final thick oxide layer that might open up during subsequent processing.

Figure 3F:
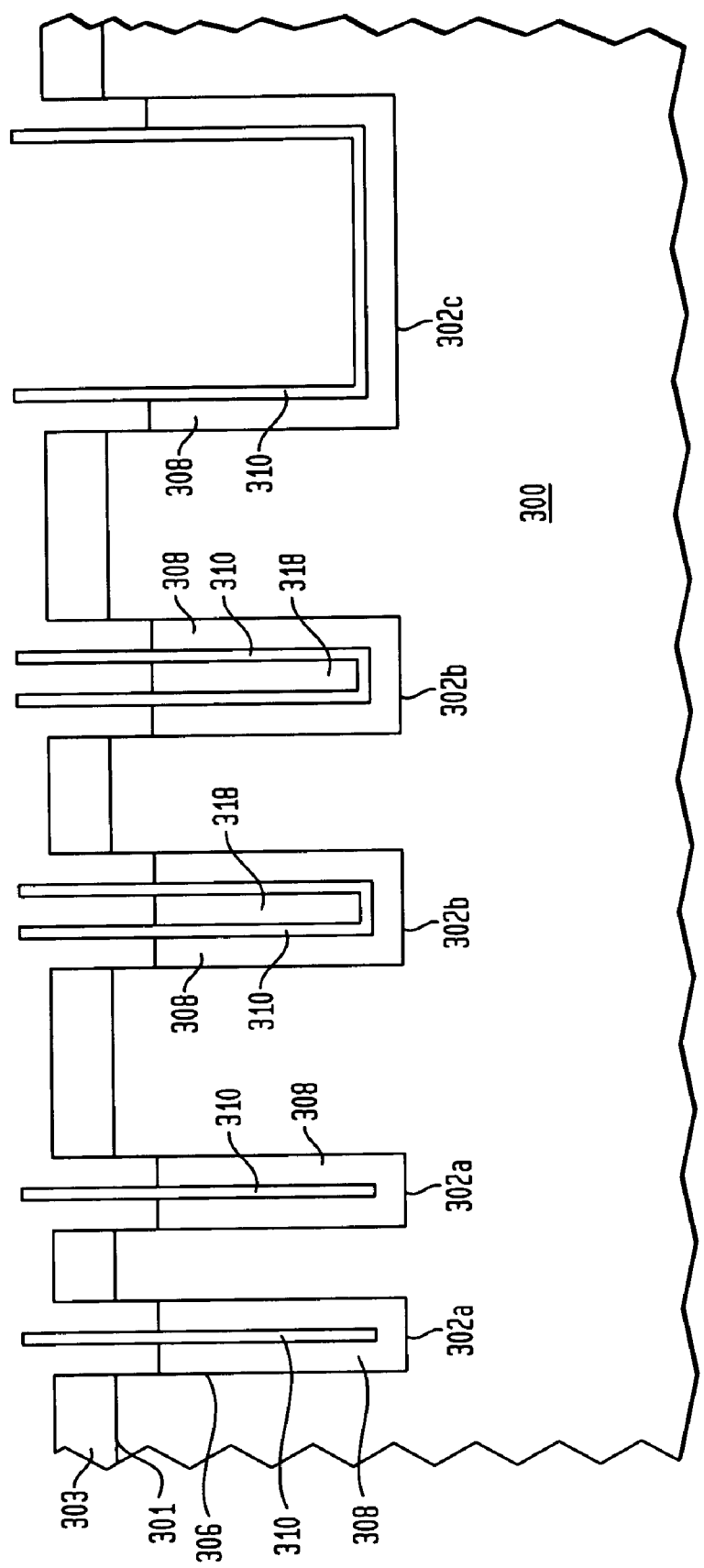
Figure 3G:
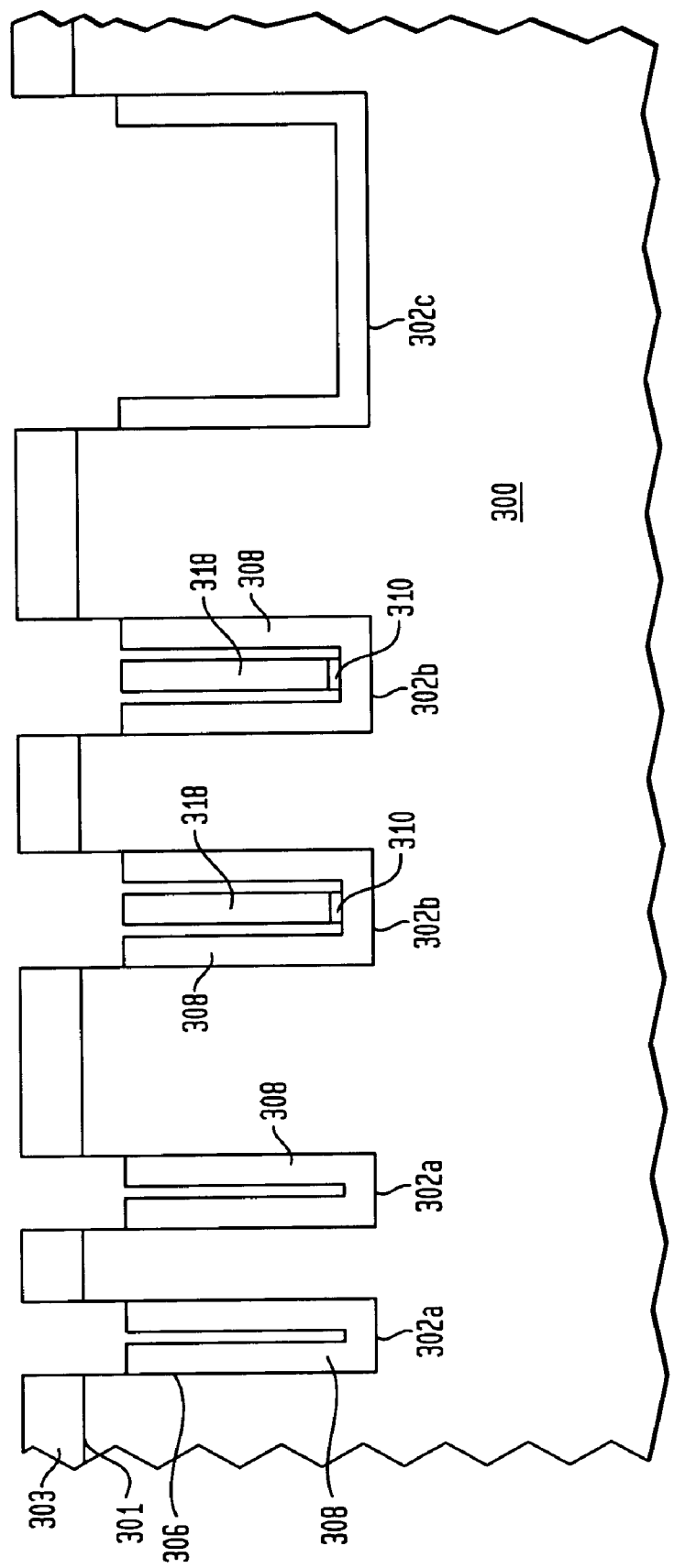

Referring now to FIG. 3F, the upper portion of the first thick oxide liner layer 308 and the further thick oxide liner layer 318 are etched, as described above with reference to FIG. 2E so that the top of the two oxide liner layers is about 100 to 2000 Å below the top surface of the silicon substrate 300. Then, as FIG. 3G shows, the polysilicon liner layer 310 is etched such that the vertical portions of the polysilicon liner layer 310 are removed but the portion beneath the further thick oxide liner layer 318 remains to prevent the further thick oxide liner layer 318 from lifting off. The etch of the polysilicon liner layer is also carried out in the manner described above.

Thereafter, as shown in FIG. 3H, the trenches 302a, 302b and 302c are filled with an HDP oxide in the manner described above with reference to FIG. 2G. Any voids 311 that may be formed in the isolation trenches are present only in the lower portions of the trenches and are not opened up during subsequent processing steps.

Figure 4B:
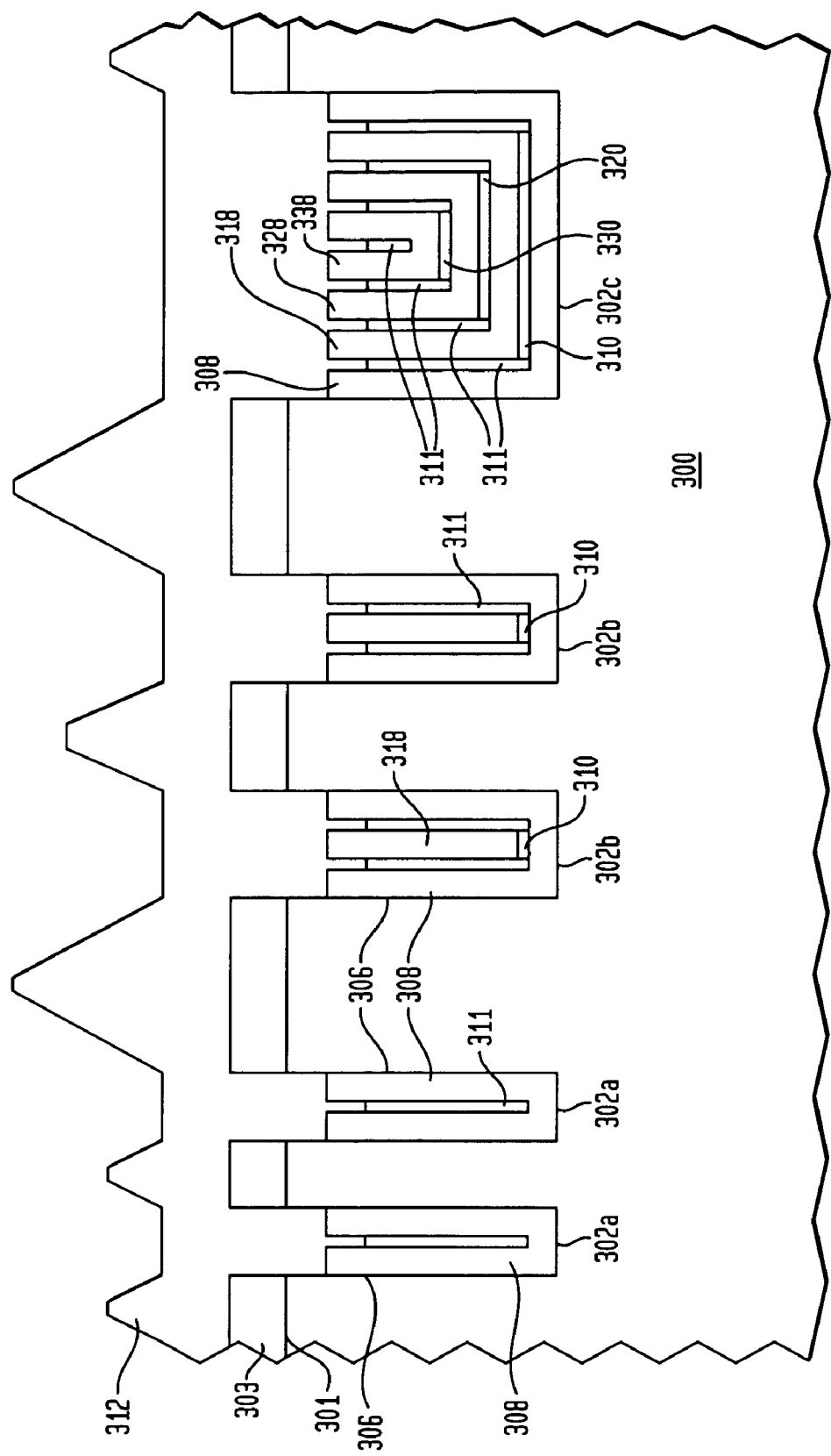

The above-described thick oxide liner etch and polysilicon liner etch may also be carried out on the thick oxide liner layers 308, 318, 328, 338 and on the polysilicon liner layers 310, 320, 330, 340, respectively, shown in FIG. 4A. As FIG. 4B shows, the thick oxide liner layers 308, 318, 328, 338 are etched to a depth of 100 to 2000 Å below the top surface of the silicon substrate 300, and portions of the polysilicon liner layers 310, 320, 330 remain underneath the remaining portions of the thick oxide liner layer 318, 328, 338, respectively, to prevent liftoff. An HDP oxide layer 312 is then deposited as described above to fill the trenches, though voids 311 may be present in the lower portions of the trenches without any adverse effects.

Advantageously, the invention provides for the filling of high-aspect ratio isolation trenches without the formation of voids in the upper region of the trenches. As a further advantage, the materials chosen provide for better isolation characteristics.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of filling an isolation trench formed in a semiconductor substrate; said method comprising:
   depositing an insulating liner layer at least along sidewalls and a bottom of said isolation trench;
   forming a silicon liner layer atop said insulating liner layer that lines said sidewalls and bottom of said isolation trench;
   removing an upper portion of said insulating liner layer;
   removing said silicon liner layer; and
   filling at least an upper portion of said trench with another insulating layer.

2. The method of claim 1 wherein a thickness of said insulating liner layer and a thickness of said silicon liner layer are selected such that said another insulating layer fills said upper portion of said trench without voids.

3. The method of claim 1 wherein said insulating liner layer is an oxide.

4. The method of claim 1 wherein said step of depositing an insulating liner layer includes a low pressure chemical vapor deposition (LPCVD) of said insulating liner layer.

5. The method of claim 1 further comprising forming an oxide layer along sidewalls and a bottom region of said isolation trench and depositing a nitride layer atop said first insulating liner layer prior to depositing said insulating liner layer.

6. The method of claim 5 wherein said oxide liner layer has a thickness of 10 to 300 Å, and said nitride layer has a thickness of 20 to 300 Å.

7. The method of claim 1 wherein said step of depositing an insulating liner layer includes depositing a portion of said insulating liner layer at least above a top of said trench; and said step forming a silicon liner layer includes depositing said silicon liner layer at least above said portion of said insulating liner layer that extends above said top of said trench, and planarizing said silicon liner layer to said top of said insulating liner layer.

8. The method of claim 1 wherein said step of depositing a silicon liner layer includes a low pressure chemical vapor deposition (LPCVD) of said silicon liner layer.

9. The method of claim 1 wherein said silicon liner layer is selected from the group consisting of polysilicon and amorphous silicon.

10. The method of claim 1 wherein said step of removing an upper portion of said insulating liner layer comprises removing at least an upper 100 to 2000 Å of said insulating liner layer.

11. The method of claim 1 wherein said step of removing an upper portion of said insulating liner layer includes at least one of a wet etch and a plasma etch of said insulating liner layer.

12. The method of claim 1 wherein said step of removing at least an upper portion of said silicon liner layer includes at least one of a wet etch and a plasma etch of said silicon liner layer.

13. The method of claim 1 wherein said another insulating layer comprises a high density plasma (HDP) deposited oxide.

14. A method of filling an isolation trench formed in a semiconductor substrate; said method comprising:
   forming a first oxide liner layer having a thickness of 10 to 300 Å along sidewalls and a bottom region of said isolation trench;
   depositing a nitride liner layer having a thickness of 20 to 300 Å atop said first oxide liner layer; and
   depositing a further oxide liner layer atop said nitride liner layer;
   depositing a silicon liner layer atop said further oxide liner layer, said silicon liner layer being selected from the group consisting of polysilicon and amorphous silicon;
   planarizing said silicon liner layer to said top of said further oxide liner layer;
   removing at least an upper 100 to 2000 Å portion of said further oxide liner layer;
   removing said silicon liner layer; and
   filling at least an upper portion of said trench with another oxide layer;
   a thickness of said further oxide liner layer and a thickness of said silicon liner layer being selected such that said another oxide layer fills an upper portion of said trench without voids.

15. A method of filling an isolation trench formed in a semiconductor substrate; said method comprising:
   (a) depositing an insulating liner layer at least along sidewalls and a bottom of said isolation trench;
   (b) forming a silicon liner layer atop said insulating liner layer that lines said sidewalls and said bottom of said isolation trench;
   (c) repeating steps (a) and (b) until said trench is filled;
   (d) removing an upper portion of said insulating liner layer;
   (e) removing an upper portion of said silicon liner layer; and
   (f) filling at least an upper portion of said trench with another insulating layer.

16. The method of claim 15 wherein a thickness of said insulating liner layer and a thickness of said silicon liner layer are selected such that said another insulating layer fills said upper portion of said trench without voids.

17. The method of claim 15 wherein said insulating liner layer is an oxide.

18. The method of claim 15 wherein said step of depositing an insulating liner layer includes a low pressure chemical vapor deposition (LPCVD) of said insulating liner layer.

19. The method of claim 15 further comprising forming an oxide layer along sidewalls and a bottom region of said isolation trench and depositing a nitride layer atop said first insulating liner layer prior to depositing said insulating liner layer.

20. The method of claim 19 wherein said oxide layer has a thickness of 10 to 300 Å, and said nitride layer has a thickness of 20 to 300 Å.

21. The method of claim 15 wherein said step of depositing an insulating liner layer includes depositing a portion of said insulating liner layer at least above a top of said trench; said step forming a silicon liner layer includes depositing said silicon liner layer at least above said portion of said insulating liner layer that extends above said top of said trench and planarizing said silicon liner layer to said top of said insulating liner layer.

22. The method of claim 15 wherein said step of depositing a silicon liner layer includes a low pressure chemical vapor deposition (LPCVD) of said silicon liner layer.

23. The method of claim 15 wherein said silicon liner layer is selected from the group consisting of polysilicon and amorphous silicon.

24. The method of claim 15 wherein said step of removing an upper portion of said insulating liner layer comprises removing at least an upper 100 to 2000 Å of said insulating liner layer.

25. The method of claim 15 wherein said step of removing an upper portion of said insulating liner layer includes at least one of a wet etch and a plasma etch of said insulating liner layer.

26. The method of claim 15 wherein said step of removing an upper portion of said silicon liner layer includes at least one of a wet etch and a plasma etch of said silicon liner layer.

27. The method of claim 15 wherein said another insulating layer comprises a high density plasma (HDP) deposited oxide.

28. The method of claim 15 further comprising depositing at least one further insulating liner layer atop said silicon liner layer prior to removing said insulating liner layer; and depositing at least one further silicon liner layer atop said further insulating liner layer.

29. A method of filling an isolation trench formed in a semiconductor substrate; said method comprising:
(a) forming a first oxide liner layer having a thickness of 10 to 300 Å along sidewalls and a bottom region of said isolation trench;
(b) depositing a nitride liner layer having a thickness of 20 to 300 Å atop said first oxide liner layer that lines the sidewalls and bottom of the isolation trench; and
(c) depositing a further oxide liner layer;
(d) depositing a silicon liner layer atop said further oxide liner layer, said silicon liner layer being selected from the group consisting of polysilicon and amorphous silicon;
(e) planarizing said silicon liner layer to a top of said further oxide liner layer;
(f) repeating steps (c), (d) and (e) until said isolation trench is filled;
(g) removing at least an upper 100 to 2000 Å portion of said further oxide liner layers;
(h) removing upper portions of said silicon liner layers; and
(i) filling at least an upper portion of said trench with another oxide layer;
a thickness of said further oxide liner layer and a thickness of said silicon liner layer being selected such that said another oxide layer fills said upper portion of said trench without voids.

30. An isolation structure formed within an isolation trench in a semiconductor substrate, said isolation trench having sidewalls and a bottom region; said isolation structure comprising:
at least two insulating liner layers formed along a lower portion of said sidewalls and along said bottom region of said isolation trench;
at least one silicon liner layer formed between said at least two insulating liner layers at a portion that lines said bottom of said isolation trench; and
another insulating layer that fills a remaining portion of said trench.

31. The isolation structure of claim 30 wherein said at least two insulating liner layers are an oxide.

32. The isolation structure of claim 30 further comprising:
an oxide layer formed along sidewalls and a bottom region of said isolation trench; and
a nitride layer formed atop said first insulating liner layer;
a first one of said insulating liner layers being formed atop a lower portion of said nitride layer.

33. The isolation structure of claim 32 wherein said oxide layer has a thickness of 10 to 300 Å, and said nitride layer has a thickness of 20 to 300 Å.

34. The isolation structure of claim 30 wherein said silicon liner layer is selected from the group consisting of polysilicon and amorphous silicon.

35. The isolation structure of claim 30 wherein said insulating liner layers cover all of said sidewalls except for an uppermost 100 to 2000 Å.

36. An isolation structure formed within an isolation trench in a semiconductor substrate, said isolation trench having sidewalls and a bottom region; said isolation structure comprising:
an oxide layer having a thickness of 10 to 300 Å formed along said sidewalls and said bottom region of said isolation trench;
a nitride layer having a thickness of 20 to 300 Å formed atop said first oxide liner layer; and
at least two insulating liner layers formed atop a lower portion of said nitride liner layer, said insulating liner layers being an oxide, said lower portion comprising all of said sidewalls except for at least an uppermost 100 to 2000 Å;
at least one silicon liner layer formed between said at least two insulating liner layers at a portion that lines said bottom of said isolation trench, said silicon liner layer being selected from the group consisting of polysilicon and amorphous silicon; and
another oxide layer that fills a remaining portion of said trench;
a thickness of said further oxide liner layer and a thickness of said silicon liner layer being selected such that said another oxide layer fills an upper portion of said trench without voids.

* * * * *